(12) United States Patent
Hoffmann et al.

(10) Patent No.: US 7,362,181 B2
(45) Date of Patent: Apr. 22, 2008

(54) PROCEDURE FOR OPERATING A HIGH FREQUENCY AMPLIFIER

(75) Inventors: Gebhard Hoffmann, Munich (DE); Andreas Salomon, Munich (DE); Georg Huber, Zolling (DE)

(73) Assignee: EADS Deutschland, Ottobrunn (DE)

( * ) Notice: Subject to any disclaimer, the term of this patent is extended or adjusted under 35 U.S.C. 154(b) by 190 days.

(21) Appl. No.: 11/353,949

(22) Filed: Feb. 15, 2006

(65) Prior Publication Data
US 2006/0192619 A1 Aug. 31, 2006

(30) Foreign Application Priority Data
Feb. 16, 2005 (DE) .................... 10 2005 007 159

(51) Int. Cl.
*H03F 1/52* (2006.01)
(52) U.S. Cl. .................... 330/298; 330/285; 330/296
(58) Field of Classification Search .............. 330/127, 330/129, 285, 296, 298
See application file for complete search history.

(56) References Cited

U.S. PATENT DOCUMENTS 6,091,302 A * 7/2000 Arevalo .................... 330/296

6,657,499 B2 * 12/2003 Lin ........................... 330/298

FOREIGN PATENT DOCUMENTS

DE     29 04 011       8/1980
DE     196 04 239 A1   8/1996

* cited by examiner

Primary Examiner—Khanh Van Nguyen
(74) Attorney, Agent, or Firm—Crowell & Moring LLP

(57) ABSTRACT

A procedure for operation of a high frequency amplifier having a power transistor—amplifier stage designed as a source or emitter circuit for amplifying a gate or base side high frequency signal supplied over an input interface network E which signal is amplified at the drain or collector side and output via an output interface network. A device for the measurement of the drain or collector current I_D is connected at the amplifier stage on the drain or collector side and a final control element is connected on the gate or base side. A pre-adjustable desired value W_SOLL and an actual value W_IST corresponding to the drain or collector current are input to the final control element, which adjusts the gate voltage or the base current so that the drain or collector current I_D is brought to the desired value W_SOLL. At a constant input power P_IN of the high frequency amplifier, the envelope curve of the output signal RF_OUT is modulated by the desired value W_SOLL.

5 Claims, 3 Drawing Sheets

PROCEDURE FOR OPERATING A HIGH FREQUENCY AMPLIFIER

BACKGROUND AND SUMMARY OF THE INVENTION

This application claims the priority of German patent document DE 10 2005 007 159.7, filed Feb. 16, 2005, the disclosure of which is expressly incorporated by reference herein.

The invention is directed to a procedure for operating a high frequency amplifier.

German patent document DE 29 04 011 discloses a high frequency amplifier with a power transistor-amplifier stage (FIG. 1). On the emitter side an input interface network E receives an input signal RF_IN produced in a signal source SQ, and on the collector side an output interface network A supplies an output signal RF_OUT. In addition, on the emitter side a constant current source controlled from a pulse generator PG is connected to the amplifier stage VS, which impresses on the collector-emitter section of the power transistor LT of the amplifier stage VS a current corresponding to the pulse course for the duration of the pulse. In this manner, an adjustment of the transmission power and a modulation of the HF envelope are possible. On the collector side an operating voltage direct current lead BZ is provided for the power transistor LT.

One disadvantage of the circuit in German patent document DE 29 04 011 is that it is usable only for bipolar transistors in the basic circuit. Moreover the direct current source K in principle entails a large power loss.

FIG. 2 shows a circuit arrangement of a linear amplifier with a MOSFET power transistor LT. An input interface network E on the gate side is led to an input signal RF_IN produced in a signal source SQ, and an output interface network A on the drain side supplies an output signal RF_OUT. Further, on the gate side a voltage generator UG adjusts the operating point of the power transistor LT. A current source BZ is connected on the drain side of the power transistor.

A disadvantage of this circuit arrangement is the large power loss in transmission breaks or in low power transmission. An additional disadvantage is the thermal dependency of the amplification; that is, a temperature change of the power amplifier causes a corresponding change in the output power. Moreover there is a threshold voltage drift caused by change in the components.

A further disadvantage is the inaccurate transmission power adjustment in the dynamic operation of the transmission circuit.

German patent document DE 196 04 239 A1 discloses a high frequency amplifier in which the output power is held constant, although the supply voltage of a battery in the course of operation is smaller.

One object of the invention is to process for operating a high frequency amplifier with decreased power loss and temperature dependency, at more precise transmission power adjustment.

Another object of the invention is to provide such a process in which the HF envelope curve can be modulated.

These and other objects and advantages are achieved by the process according to the invention in which a high frequency amplifier includes a power transistor-amplifier stage in a source or transmitter circuit, for the amplification of the respective gate or base side high frequency signal supplied over an input interface network that is driven in such a way that the high frequency signals supplied over the input interface network amplified on the drain or collector side are taken over an output interface network. A device for the measurement of the drain or collector current I_D is connected at the amplifier stage on the drain or collector side, and on the gate or base side there is a variable attenuator to which a pre-settable desired value W_SOLL and an actual value W_IST corresponding to the drain or collector current is conducted. The gate voltage or the base current is adjusted over the variable attenuator in such a way that the drain or collector current I_D is subsequently led to the desired value W_SOLL, so that a constant input power P_IN of the high frequency amplifier modulates the envelope curve of the output signal RF_OUT by the desired value W_SOLL.

The procedure according to the invention is suitable for high frequency amplifiers with FET transistors as well as for high frequency amplifiers with bipolar transistors. In the following description, the designations drain, gate, or source side refer to FET transistors, while the designations collector, base, or emitter side refer to the bipolar transistors.

Other objects, advantages and novel features of the present invention will become apparent from the following detailed description of the invention when considered in conjunction with the accompanying drawings.

DETAILED DESCRIPTION OF THE DRAWINGS

Figure 1:
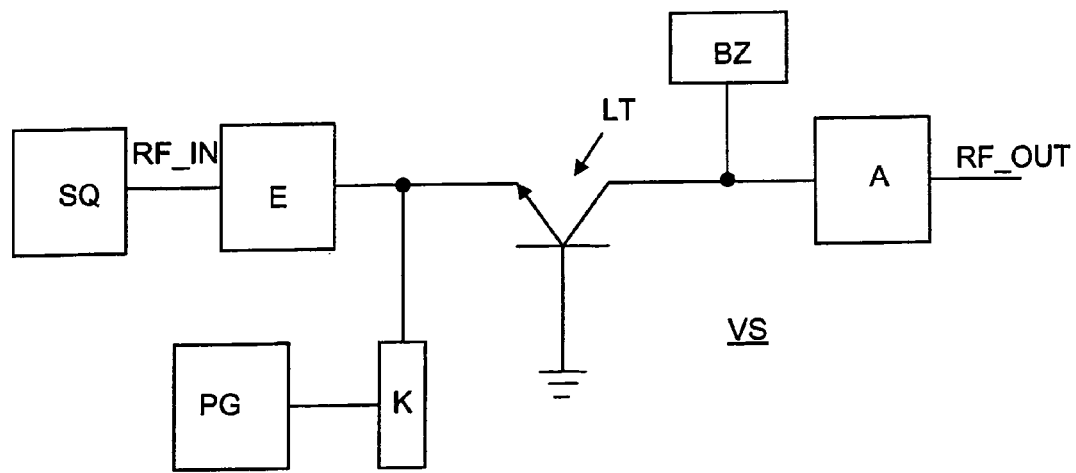
FIG. 1. a circuit design of a high frequency pulse amplifier according to the prior art.
Figure 2:
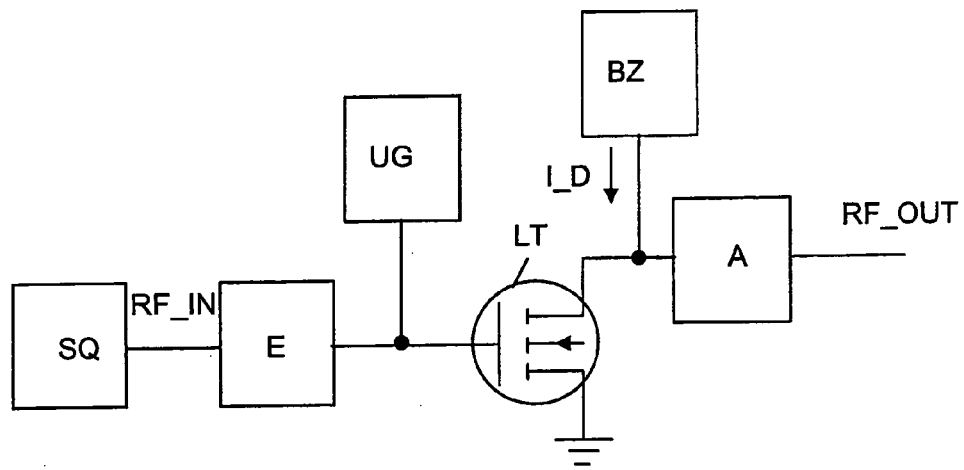
FIG. 2. a circuit design of a linear amplifier according to the prior art.
Figure 3:
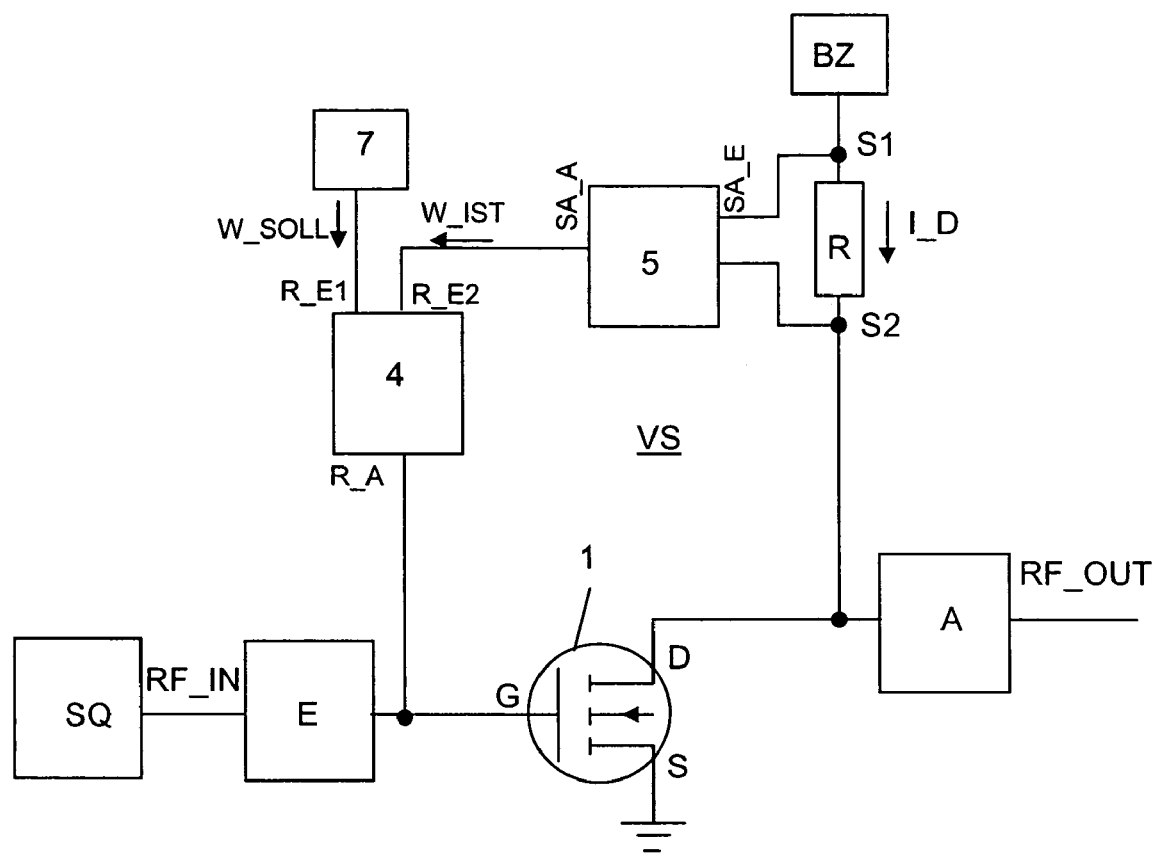
FIG. 3 illustrates an example of circuit design of a high frequency amplifier which is operated according to the invention, in FET technology.

FIG. 3 shows a circuit design for a high frequency amplifier, using FET technology which is operated according to the invention; however a person skilled in the art will easily know how to implement such a circuit design also using bipolar technology.

The amplifier stage VS includes an FET transmitting transistor 1 with input and output interface networks E, A, as well as a variable attenuator 4 (e.g., an adjustable amplifier), a signal interface network 5 and a closed regulator circuit including a resistance R.

The FET transmission transistor 1 may be, for example, an LDMOS, a GaAS MESFET, or a SiC MESFET transistor. The gate terminal G of the transistor 1 is connected to an input interface network E, which receives from a signal source SQ an RF signal RF_IN, which is to be amplified. The source terminal S of the transistor 1 is connected to the ground, while the drain connection D is connected via an output interface network A, to an output at which the amplified RF signal RF_OUT is generated.

The drain connection D of the transistor 1 is advantageously connected with the voltage source BZ via a resistance R for measuring the drain current I_D. The connections S1, S2 of the resistance R are connected with a signal interface network 5. It is advisable for the dimensions of the resistance R to be chosen so that only a small power loss occurs.

The final control element 4 has two inputs R_E1, R_E2, and is connected via an output R-A with the gate connection G of the transistor 1. The one input R_E1 of the final control element 4 is connected with a device 7 which supplies the final control element 4 with a pre-adjustable desired value W_SOLL. The other input R_E2 of the final control element 4 receives from the signal interface network 5 the actual value W_IST which is proportional to the drain current I_D. The signal interface network 5 forms at its output SA_A the drain current I_D which flows through the resistance R. For this purpose the signal interface network 5 is connected with the connections S1, S2 of the resistance.

In an advantageous implementation of the invention, the device 7 may be a pulse generator, whose pulses are supplied to the final control element 4 with a pre-adjustable amplitude and a pre-adjustable pulse form. In this manner, it is thereby possible to influence the envelope curve of the output signal RF_OUT. It is advisable to let it reach such an amplitude or pulse modulation of the output signal RF_OUT. In the pulse modulation it is especially possible to limit the spectral width of the spectrum of the output signal RF_OUT by using the rise and fall times of the individual pulses.

The high frequency amplifier operated according to the invention is characterized by the fact that in transmission pauses (i.e., when the gate voltage delivered from the final control element 4 suppresses the transistor 1) no power is taken from the voltage source BZ. This arrangement favorably influences the effectiveness of the circuit, which is approximately dependent upon the output power P_OUT produced.

The manner of operation of the high frequency amplifier is thereby as follows:

An externally supplied, pre-adjustable desired value W_SOLL is fed to the final control element 4 at its input R_E1. The actual drain current I_D is measured by the resistance R and converted in the signal interface network 5 into a proportional actual value W_IST which is fed to the input R_E2 of final control element 4. By a change of the gate voltage of the transistor 1 at the output R_A, the final control element 4 causes the drain current actual value W_IST to conform to the drain current desired value W_SOLL, since a change in the gate voltage leads to a change in the drain current I_D, which again effects a change in the voltage picked up at the resistance R.

With the amplifier circuit the drain current I_D is kept constant, regardless of the input power of the input signal RF_IN. By means of the externally pre-supplied desired value R_E1, the power of the output signal RF_OUT is adjusted within the limits given by the amplification of the transistor 1. In this manner, the transmission power (output power) can be adjusted and adapted dynamically to the corresponding requirements.

An additional advantage of its high power amplifier is the high power stability when there are fluctuations in the input power P_IN or of the temperature. In addition, the high power amplifier shows a high power stability when there is a drift of the threshold voltage of the power transistor, especially due to a change in the components.

The high power amplifier can be used in phase or frequency modulated systems, in which a constant amplitude is required over a transmission message, e.g., in telecommunications systems, especially cell phones or in radar devices or in consumer electronics systems.

A further application according to the invention is in linear polar amplifiers, in which phase information is modulated in the signal source SQ and the amplitude information is modulated in the power amplifier. This makes it possible to achieve highly efficient linear amplifiers such as are required for example for the new generation of software defined radio (SDR).

Figure 4:
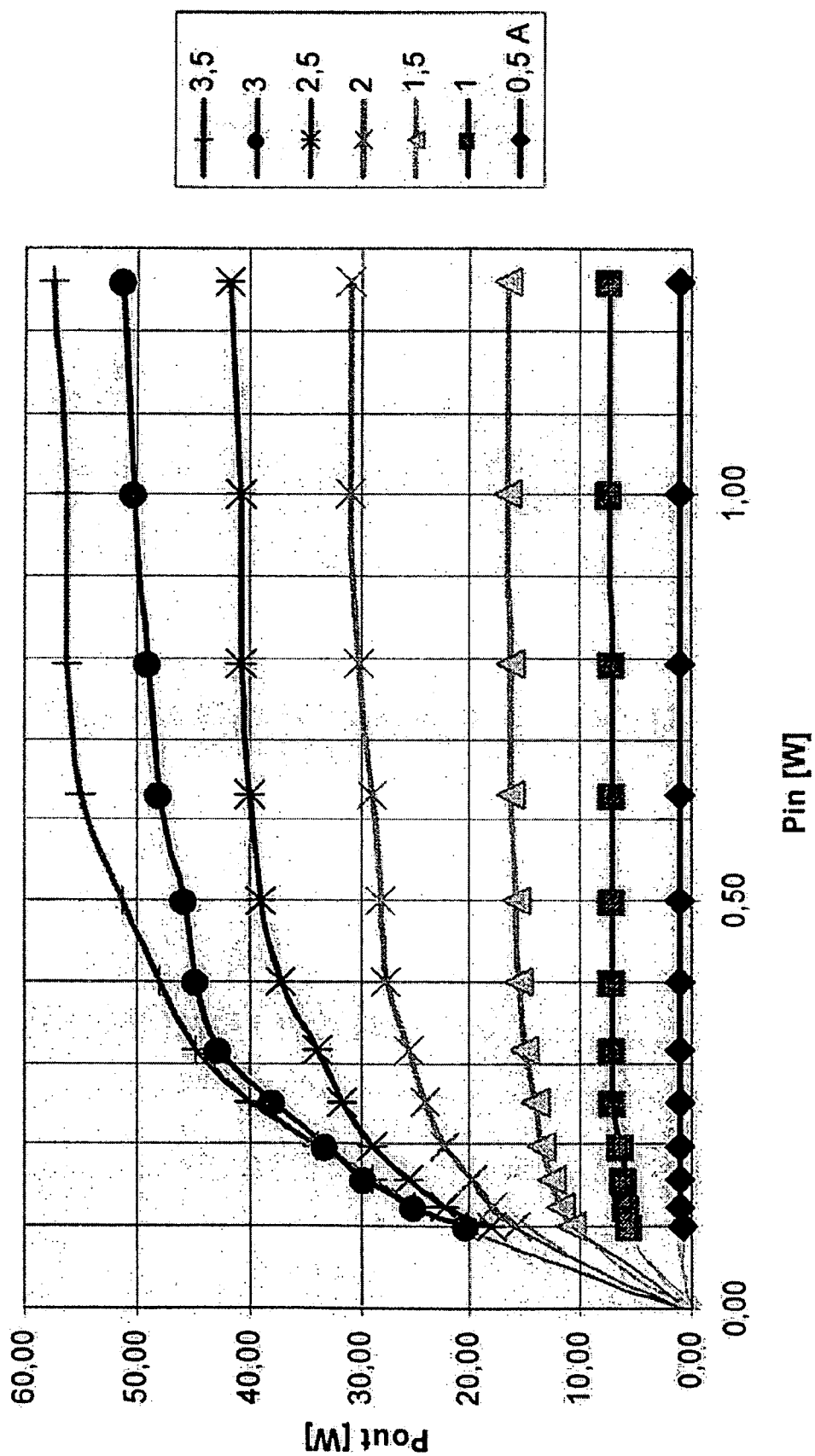
FIG. 4 shows an example of a family of characteristic curves of the output power vs. the input power with various drain currents, for a high frequency amplifier driven according to the invention.

FIG. 4 shows an example of a family of characteristic curves (output power P_OUT vs. input power P_IN, for various drain currents) for a high frequency amplifier operated according to the invention. The illustration shows that the output power P_OUT can be held constant within a wide range, almost independently of the input power P_IN. The output power P_OUT can be adjusted over the drain current I_D parameter.

From the illustration it is clear that for small input powers P_IN and/or large drain current I_D, the high frequency amplifier behaves like a class A amplifier in which the output power P_OUT follows the input power P_IN linearly. The output power P_OUT is kept constant, however, so long as the input power P_IN is greater than the output power reduced for the amplification of the transistor.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A process for operating a high frequency amplifier having a source or emitter designed power transistor—amplifier stage for amplification of a high frequency signal that is input to a gate or base terminal via an input interface network E, which signal is amplified at a drain or collector terminal and output via an output interface network; said process comprising:
   at a drain or collector terminal, providing a device for measuring the drain or collector current;
   connecting a final control element at a gate or base terminal;
   feeding to the final control element a corresponding desire value W_SOLL and an actual value W_IST corresponding to drain or collector current I_D; and
   at a constant input power P_IN of the high frequency amplifier, modulating an envelope curve of the output signal RF_OUT by the desired value W_SOLL.

2. The process according to claim 1, further comprising:
   a pulse generator feeding to the final control element a pulse with a pre-adjustable amplitude and pulse form.

3. The process according to claim 2 for implementation of a linear polar amplifier, in which phase information in the signal source and amplitude information in the high frequency amplifier are modulated, whereby the desired value W_SOLL is adjusted to correspond to the amplitude information.

4. A high frequency amplifier circuit, comprising:
   a source or emitter designed power transistor stage;
   an input interface network for supplying a high frequency input signal to a gate or base terminal of said power transistor stage;
   a current sensing device for measuring drain or collector current of said power transistor stage;
   a final control element having a first input connected to said current sensing device for receiving a signal indicative of an actual value of drain or collector current, a second input for receiving a desired value of said drain or collected current, and an output connected to supply a control signal to a gate or base terminal of said power transistor stage; and
   means, operable at a constant input power of the high frequency amplifier, for modulating an envelope curve of the output signal by the desired value of the drain or collector current.

5. The amplifier circuit according to claim 4, further comprising a pulse generator connected to supply to said input of said final control element a pulse with a pre-adjustable amplitude and pulse form.

* * * * *